(12) United States Patent
Perndl et al.

(10) Patent No.: US 10,135,553 B2
(45) Date of Patent: Nov. 20, 2018

(54) MEASURING SYSTEM FOR OVER-THE-AIR POWER MEASUREMENTS

(71) Applicant: Rohde & Schwarz GmbH & Co. KG, Munich (DE)

(72) Inventors: Werner Perndl, Zorneding (DE); Markus Gallhauser, Freising (DE); Gerd Hechtfischer, Vaterstetten (DE); Nino Voss, Munich (DE); Adam Tankielun, Ottobrunn (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 15/214,114

(22) Filed: Jul. 19, 2016

(65) Prior Publication Data
US 2017/0244503 A1    Aug. 24, 2017

(30) Foreign Application Priority Data

Feb. 19, 2016   (EP) ..................... 16156454

(51) Int. Cl.
*H04B 17/00*      (2015.01)
*H04B 17/318*    (2015.01)
(Continued)

(52) U.S. Cl.
CPC ........... *H04B 17/318* (2015.01); *G01R 19/04* (2013.01); *G01R 21/10* (2013.01); *G01R 21/14* (2013.01);
(Continued)

(58) Field of Classification Search
CPC ..... H04W 24/08; H04W 24/10; H04W 24/06; H04W 36/0088; H04B 17/318;
(Continued)

(56) References Cited

U.S. PATENT DOCUMENTS

| 5,083,080 A | * | 1/1992 | Tagiri | ................... | G01R 27/28 |
| | | | | | 324/115 |
| 5,489,888 A | * | 2/1996 | Jagiella | ................. | G01B 7/023 |
| | | | | | 324/611 |

(Continued)

FOREIGN PATENT DOCUMENTS

| CN | 97209431 | * | 3/1997 |
| CN | 2299398 Y | | 12/1998 |

(Continued)

OTHER PUBLICATIONS

European Office Action for related European Patent Application No. 16156454.7-1568 dated Aug. 8, 2016, 8 Pages.

(Continued)

*Primary Examiner* — Edward Urban
*Assistant Examiner* — Max Mathew
(74) *Attorney, Agent, or Firm* — Ditthavong & Steiner, P.C.

(57) ABSTRACT

A measuring system for measuring a high frequency signal is provided. The measuring system comprises an antenna module, adapted for receiving the high frequency signal. Moreover, the system comprises a detector module adapted for deriving a measuring signal from the high frequency signal. Finally, the system comprises a sensor module adapted for measuring the measuring signal. The sensor module is arranged in a housing, while the detector module is not arranged in the housing. The detector module is connected to the sensor module by a first cable, which is adapted to transmit the measuring signal from the detector module to the sensor module.

13 Claims, 3 Drawing Sheets

(51) Int. Cl.
*H04B 17/10* (2015.01)
*G01R 19/04* (2006.01)
*G01R 21/10* (2006.01)
*G01R 21/14* (2006.01)
*G01R 23/00* (2006.01)
*G01R 29/08* (2006.01)

(52) U.S. Cl.
CPC ......... *G01R 23/00* (2013.01); *G01R 29/0878* (2013.01); *H04B 17/0085* (2013.01); *H04B 17/102* (2015.01)

(58) Field of Classification Search
CPC .. H04B 17/0085; H04B 17/29; H04B 17/309; H04B 17/19; H04B 17/18; H04B 17/101; H04B 1/0007; G01R 23/16; G01R 15/09; G01R 19/0092; G01R 15/08
USPC .......... 455/67.11–67.7; 324/76.19, 118, 115, 324/616, 611; 381/106
See application file for complete search history.

(56) References Cited

U.S. PATENT DOCUMENTS

| | | | | |
|---|---|---|---|---|
| 7,133,644 | B2* | 11/2006 | Demir | H03F 1/3294 455/67.11 |
| 7,283,792 | B2* | 10/2007 | Chmiel | H03G 3/3042 330/129 |
| 7,376,200 | B2* | 5/2008 | Demir | H03C 3/406 375/225 |
| 7,457,594 | B2* | 11/2008 | Theobold | G01R 29/0878 455/115.1 |
| 7,561,878 | B2* | 7/2009 | Tam | H04W 24/00 370/241 |
| 2005/0156607 | A1* | 7/2005 | Okamura | G01F 23/284 324/639 |
| 2006/0258293 | A1* | 11/2006 | Steffen | G01R 23/00 455/67.11 |
| 2010/0289477 | A1* | 11/2010 | Reichel | G01R 19/02 324/76.19 |
| 2011/0050536 | A1* | 3/2011 | Shtatnov | H01Q 7/005 343/870 |
| 2011/0171912 | A1* | 7/2011 | Beck | G01S 5/0221 455/67.11 |
| 2011/0300809 | A1* | 12/2011 | Gordiyenko | H04B 17/23 455/67.12 |
| 2013/0193985 | A1* | 8/2013 | Tillotson | H03K 17/9525 324/616 |
| 2013/0293249 | A1* | 11/2013 | Han | G01R 1/045 324/750.02 |
| 2014/0329472 | A1* | 11/2014 | Kovacs | H04B 17/0085 455/67.14 |
| 2016/0124041 | A1* | 5/2016 | Pathak | G01R 29/08 324/629 |
| 2016/0380352 | A1* | 12/2016 | Liu | H04W 16/28 342/359 |
| 2017/0237161 | A1* | 8/2017 | Roy | H01Q 1/288 343/757 |

FOREIGN PATENT DOCUMENTS

DE 19913338 A1 9/2000
DE 102006038031 A1 11/2007

OTHER PUBLICATIONS

Nelson, "High-frequency Instruments", EDN Magazine, Feb. 1, 1981, vol. 26, No. 4, pp. 77-88, 12 Pages.

* cited by examiner

MEASURING SYSTEM FOR OVER-THE-AIR POWER MEASUREMENTS

TECHNICAL FIELD

The invention relates to a measuring system for wirelessly measuring high frequency signals, especially the power of high frequency signals.

BACKGROUND ART

In recent years, the frequencies employed for transmitting communications signals have continually risen. When measuring such high frequencies, a new set of problems has arisen. Directly connecting a device under test to a measuring device influences the measuring results. Placing a large measuring antenna close to the device under test is also problematic.

For example, the German patent application DE 199 13 338 A1 shows a measuring circuit for detecting the power of high frequency signals.

There arises the need to provide a measuring system, which is able to measure signals of very high frequency emitted by devices under test.

SUMMARY OF THE INVENTION

According to a first aspect of the invention, a measuring system for measuring a high frequency signal is provided. The measuring system comprises an antenna module, adapted for receiving the high frequency signal. Moreover, the system comprises a detector module, adapted for deriving a measuring signal from the high frequency signal. Finally, the system comprises a sensor module, adapted for measuring the measuring signal. The sensor module is arranged in a housing, while the detector module is not arranged in the housing. The detector module is connected to the sensor module by a first cable, which is adapted to transmit the measuring signal from the detector module to the sensor module. It is thereby possible to significantly reduce the footprint of the detector module and thereby place the detector module very close to the device under test. At the same time, the larger sensor module can be placed far apart from the device under test, thereby achieving optimal measuring conditions.

According to a first preferred implementation form of the first aspect, the antenna module and the detector module are integrated into a combined module. This allows for an even further decrease of the footprint of the combined module.

According to a second preferred implementation form of the first aspect, which is an alternative to the first implementation form, the antenna module is connected to the detector module by a second cable. It is thereby possible to, on the one hand achieve a very flexible set-up. On the other hand, it is possible to even further decrease the footprint of the antenna module, which must be placed closest to the device under test.

According to a third preferred implementation form of the first aspect, the detector module comprises a chopper, which is adapted to modulate a signal derived from the high frequency signal, resulting in a signal, the measuring signal is derived from. By placing a chopper on the detector module, it is possible to decrease the influence of noise for the transmission from the detector module to the sensor module. This allows for a reduced shielding effort for the connection between the detector module and the sensor module.

According to a fourth preferred, implementation form of the first aspect, the detector module comprises a detector, which is adapted to perform a detection of a signal derived from the high frequency signal. Especially, the detector can be a diode sensor, which is adapted to perform a rectification of the signal derived from the high frequency signal. By performing this pre-processing on the detector module, it is possible to transform the high frequency signal received by the antenna module into a signal, which is significantly easier to transmit without signal interference.

According to a first preferred implementation of a preferred fifth implementation form of the first aspect, the antenna module comprises a slotline antenna and a transformer. The transformer is adapted to transform a slotline antenna signal provided by the antenna into a coplanar antenna signal. The detector is adapted to receive the coplanar antenna signal. By having the detector in coplanar technology, it is possible to achieve a very high performance detector. By having the antenna in slotline format, a very small footprint antenna can be achieved.

According to a fifth preferred implementation form of the first aspect, the detector module comprises a first amplifier, which is adapted to amplify a signal derived from the high frequency signal resulting in the measuring signal. By performing an amplification before transmitting the measuring signal to the sensor module, a further decrease in interference sensitivity is achieved.

According to a sixth preferred implementation form of the first aspect, the antenna module and/or the detector module comprise a temperature sensor, which is adapted to determine a present temperature at its location. The antenna module and/or the detector module then comprise a communication unit, which is adapted to transmit the present temperature determined by the temperature sensor to the sensor module. Thereby, the present temperature of the antenna module and/or the detector module is available to the sensor module, which can use this information for performing correction calculations.

According to a seventh preferred implementation form of the first aspect, the antenna module and/or the detector module comprise a storage unit, which is adapted to store parameters of the antenna module and/or the detector module. Especially, calibration parameters can be stored there. This allows for performing correction calculations based upon the individual antenna module and/or detector module by the sensor module.

According to a first preferred implementation of the preferred seventh implementation form, the storage unit is an RFID chip or a barcode. The sensor module is adapted to read the parameters of the antenna module and/or the detector module stored in the storage unit. The sensor module can then use the parameters for performing the correction calculations.

According to a second alternative preferred implementation of the seventh implementation form, the storage unit is a flash memory or a magnetic memory. The antenna module and/or the detector module then comprise a communication unit, which is adapted to transmit the parameters of the antenna module and/or the detector module stored in the storage unit to the sensor module. Also then the sensor module can use the parameters for performing the correction calculations.

According to an eighth preferred implementation form of the first aspect, the sensor module comprises a second amplifier, which is adapted to amplify the measuring signal received from the detector module. By performing an amplification directly after receiving the measuring signal, the signal can be regenerated and further information loss can be prevented.

According to a ninth preferred implementation form of the first aspect, the sensor module comprises an analog-digital-converter, which is adapted to digitize a signal derived from the measuring signal received from the detector module. As soon as the measuring signal is digitized, no further information loss occurs. By placing the analog-digital-converter onto the sensor module, it is possible to use especially accurate but large analog-digital-converters. Using such analog-digital-converters on the antenna module or on the detector module, would be disadvantageous, since they would significantly increase the size of the respective module. Also an accurate temperature control of the analog-digital-converter, which further increases the size of the analog-digital-converter, can be performed here.

According to a tenth preferred implementation form of the first aspect, the sensor module comprises a digital signal processor, which is adapted to perform post-processing on a signal draft from the measuring signal received from the detector module. This digital signal processor can especially use the information from the temperature sensor and/or the parameters of the antenna module or the detector module for performing the post-processing. This significantly reduces the errors within the signal.

According to a first preferred implementation of the tenth implementation form of the first aspect, the sensor module comprises a first communication unit, which is adapted to receive from the detector module and/or the antenna module, a present temperature of the detector module and/or the antenna module. Additionally or alternatively, the first communication unit is adapted to receive from the detector module and/or the antenna module, parameters of the detector module and/or the antenna module. The digital signal processor is then adapted to perform the post-processing of the signal derived from the measuring signal received from the detector module, compensating for the present temperature of the detector module and/or the antenna module, and/or compensating for the parameters of the detector module or the antenna module. An especially accurate measurement can thereby be achieved.

BRIEF DESCRIPTION OF THE DRAWINGS

An exemplary embodiment of the invention is now further explained by way of example only with respect to the drawings, in which.

DETAILED DESCRIPTION OF THE PREFERRED EMBODIMENTS

Figure 1:
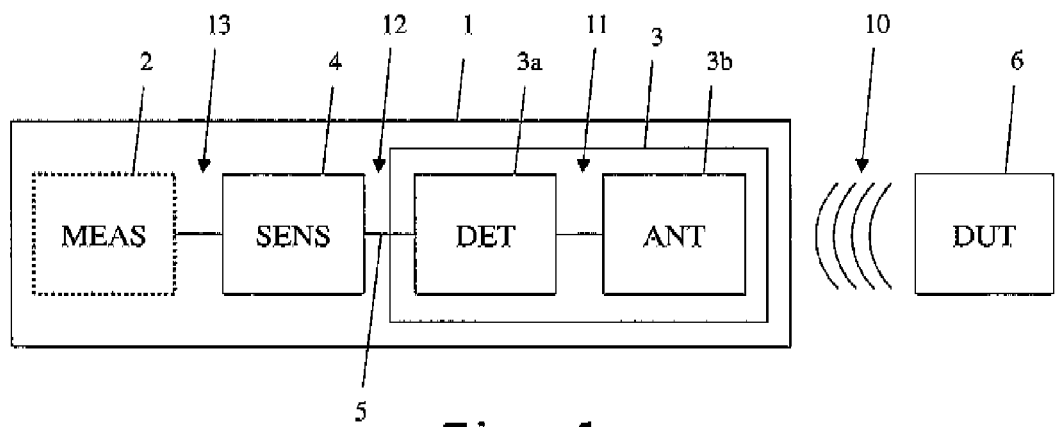
FIG. 1 shows a block diagram of a first embodiment of the measuring system according to the invention in a schematic diagram.
Figure 2:
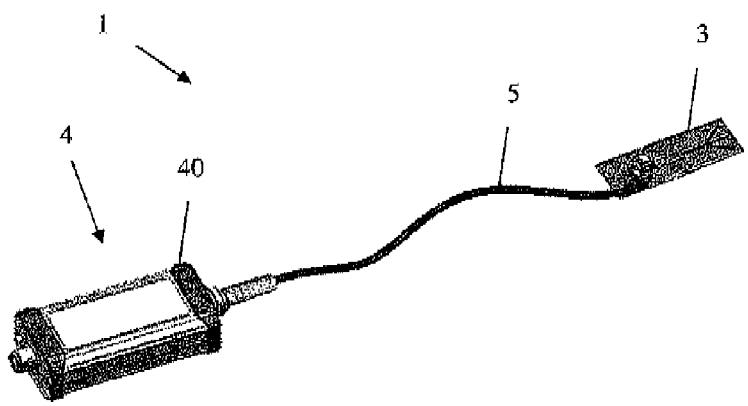
FIG. 2 shows a second embodiment of the measuring system according to the invention in a three-dimensional view.

First, we demonstrate the general setup of an embodiment of the measuring system along FIG. 1 and FIG. 2. Along FIG. 3 and FIG. 4, further details of the construction and function of different embodiments are shown. Similar entities and reference numbers in different figures have been partially omitted.

Reference will now be made in detail to the preferred embodiments of the present invention, examples of which are illustrated in the accompanying drawings. However, the following embodiments of the present invention may be variously modified and the range of the present invention is not limited by the following embodiments.

First Embodiment

In FIG. 1, a first embodiment of the measuring system 1 according to the first aspect of the invention is shown. The measuring system 1 comprises a measuring device 2, which is connected to a sensor module 4, which in turn is connected to a detector module 3a. The detector module 3a in turn is connected to an antenna module 3b. The detector module 3a and the antenna module 3b form a combined module 3. The detector module 3a and the sensor module 4 are connected via a cable 5. The cable 5 can be an electrical cable or an optical cable. Especially, it can be a coaxial cable or a fiber-optic cable.

The measuring device 2 is a stand-alone measuring device, for example a signal analyzer. It is important to note that the measuring device 2 is only an optional component and not necessary for the invention. In case it is used, the measuring device is connected via a cable to the sensor module 4. The sensor module 4 for example is a power sensor. Also a wireless connection is possible.

Advantageously, the detector module 3a and the antenna module 3b each comprise a single printed circuit board holding all further components of the respective module 3a, 3b. In case of using a combined module 3, the combined module advantageously comprises only a single printed circuit board holding all components of the detector module 3a and the antenna module 3b.

A device under test 6 is placed close to the antenna module 3h in a main radiation direction of an antenna of the antenna module 3b. The device under test 6 emits a high frequency signal 10, which is received by the antenna of the antenna module 3b. The antenna module 3b performs some pre-processing, which is described, in greater detail along FIG. 3. The resulting pre-processed signal 11 is passed on to the detector module 3a, which performs further pre-processing, transforming the pre-processed signal into a measuring signal 12, which is handed to the sensor module 4. The sensor module 4 performs the measurement of the measuring signal 12, determining for example the power of the high frequency signal 10 emitted by the device under test 6. A measuring result 13 can now be transmitted for example to a computer or to a further measuring device 2, which stores or further processes the measuring result 13.

Second Embodiment

In FIG. 2, a three-dimensional image of the measuring system 1 is depicted. Especially, the sensor module 4, the cable 5 and the combined module 3, which comprises the detector module 3a and the antenna module 3b of FIG. 1, is clearly visible. Here, it is especially evident that the sensor module 4 comprises a housing 40, which does not encompass the detector module 3a and the antenna module 3b, which are comprised by the combined module 3. Also it is shown here that the combined module 3 comprises a single printed circuit board, which, holds all further components of the combined module 3.

Figure 3:
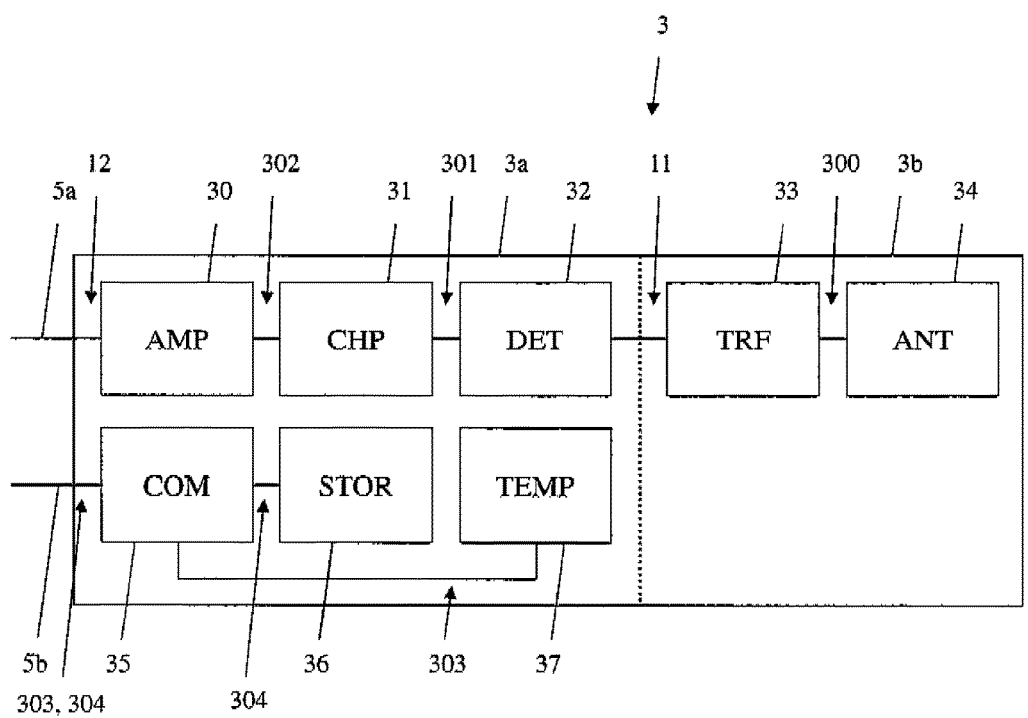
FIG. 3 shows a detail of a third embodiment of the measuring system according to the invention in a schematic diagram.
Figure 4:
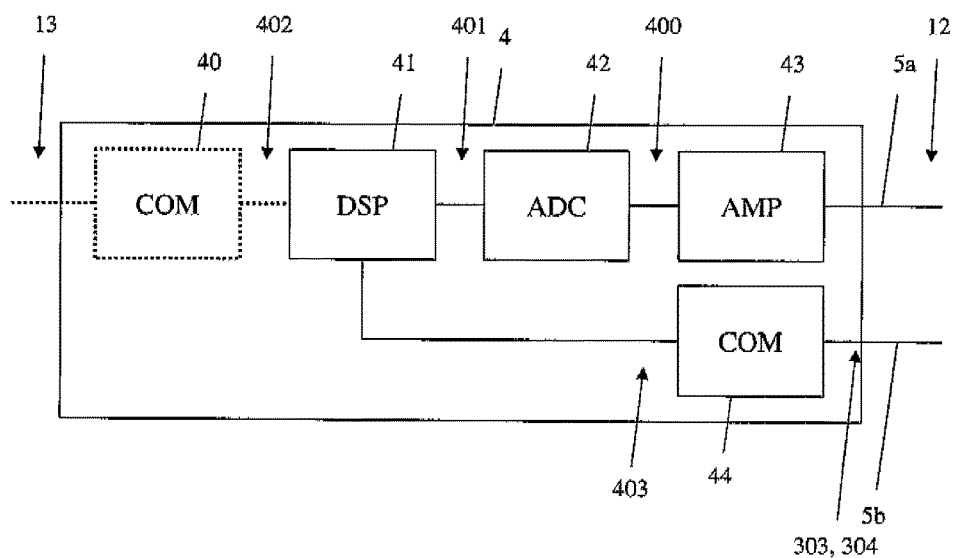
FIG. 4 shows a detail of a fourth embodiment f the measuring system according to the invention in a schematic diagram.

Regarding the specific construction and function of the sensor module 4, the detector module 3a and the antenna module 3b, it is referred to FIG. 3 and FIG. 4.

Third Embodiment

In FIG. 3, the detector module 3a and the antenna module 3b of FIG. 1 are shown in greater detail. Here, the detector module 3a and the antenna module 3b are integrated into a combined module 3. The combined module 3, comprises an antenna 34, which is connected to a transformer 33. Both, the antenna 34 and the transformer 33 are arranged on the antenna module 3b part of the combined module 3. The antenna 34 advantageously is a planar antenna, advantageously a planar slotline antenna.

In order to achieve optimal reception conditions without interfering reflections, an area surrounding the antenna 34 can be coated in radio frequency absorbing material. Also it is possible to slant all surfaces of the system 1 away from a normal of a main radiation direction of the antenna 34, so as to minimize reflections. Also a minimizing of surfaces facing the main radiation direction of the antenna 34 is beneficial for the same reason.

The transformer 33 is connected to a detector 32, which in turn is connected to a chopper 31. The chopper 31 is connected to an amplifier 30, which again is connected to a cable 5a, which is part of the cable 5 of FIG. 1 and FIG. 2. The detector 32, the chopper 31 and the amplifier 30 are all integrated into the detector module 3a part of the combined module 3. Moreover, the detector module 3e part of the combined module 3 comprises a temperature sensor 37, a storage unit 36 and a communication unit 35. The temperature sensor 37 and the storage unit 36 are both connected to the communication unit 35, which in turn is connected to a cable 5b, which is part of the cable 5 of FIG. 1 and FIG. 2.

When the device under test 6 emits the high frequency signal 10, the high frequency signal 10 is received by the antenna 34 as an antenna signal, preferably as a slotline antenna signal. The antenna 34 in this example is a slotline antenna, which receives the high frequency signal 10 and makes it available as a slotline antenna signal 300 to the transformer 33. Handling such a slotline antenna signal is very complicated. Therefore, the transformer 33 transforms the slotline antenna signal 300 to a coplanar antenna signal 11 of FIG. 1 and FIG. 2, which is handed to the detector 32. The detector 32 performs a detection of the signal 11, advantageously it performs a rectification of the coplanar antenna signal 11. A resulting signal 301 is provided to the chopper 31, which performs a low-frequency modulation by continuously inverting the polarity of the signal 301. This reduces the interference sensitivity of the resulting signal 302. The chopped signal 302 is handed to the amplifier 30, which amplifies it and transmits a resulting signal 12 over the cable 5a to the sensor module 4.

At the same time, the temperature sensor 37 determines a present temperature 303 and hands it on to the communication unit 35. The communication unit 35 transmits the current temperature 303 determined by the temperature sensor 37 through the cable 5b to the sensor module 4.

The storage unit 36 stores parameters of the detector module 3a and/or the antenna module 3b. These can be, for example, calibration details of the modules 3a, 3b. These are individual for each specific antenna module 3b and detector module 3a. For example, the storage unit 36 can be a flash memory or a magnetic memory. This information 304 is also transmitted by the communication unit 35 to the sensor module 4.

Instead of storing the parameters of the detector module 3a and/or the antenna module 3b in an electronically readable storage unit 36 as shown in FIG. 3, it is also possible to store this information in a wirelessly readable format, for example an RFID chip.

In an especially simple implementation form, the parameters can also be stored in form of a barcode, especially a two-dimensional barcode printed or glued to the surface of the detector module 3a and/or antenna module 3b. Also in this case, the sensor module 4 comprises a respective barcode reader capable of reading the information stored within the barcode.

The temperature sensor 37, the storage unit 36 and the communication unit 35 can also be arranged on the antenna module 3b. It is even possible to provide a separate temperature sensor for the detector module 3a and for the antenna module 3b. An especially accurate determining of the temperature of the individual components is thereby possible.

Advantageously, the antenna module 3b or the detector module 3a furthermore comprises a mixer and a local oscillator, which are adapted to mix a signal derived from the high frequency signal 10 with a local oscillator signal, resulting in an intermediate frequency signal of lower frequency than the high frequency signal. This intermediate frequency signal is then further processed as described above. It must be noted, that this frequency transformation can occur at any processing stage between the described antenna 34 and the described chopper 31.

Fourth Embodiment

In FIG. 4, details of the construction of the sensor module 4 of FIG. 1 and FIG. 2 are shown. The sensor module 4 comprises a communication unit 40, connected to a digital signal processor 41. The digital signal processor 41 again is connected to an analog-digital-converter 42, which is connected to an amplifier 43. The amplifier 43 is connected to cable 5a of FIG. 3. Moreover, the digital signal processor 41 is connected to a further communication unit 44, which is connected to the cable 5b of FIG. 3.

When receiving the measuring signal 12 through cable 5a from the amplifier 30 of FIG. 3, the amplifier 43 amplifies the signal 12 again, resulting in an amplified signal 400. The amplified signal 400 is provided to the analog-digital-converter 42, which digitizes it and provides a resulting digital signal 401 to the digital signal processor 41.

Through cable 5b, the communication unit 44 receives the temperature information 303 and parameter information 304 from the communication unit 35 of FIG. 3. The communication unit 44 provides this information 303, 304 to the digital signal processor 41.

In case the parameter information is stored in an RFID chip, the sensor module 4 comprises an RFID reader for reading this information and, providing it to the digital signal processor 41. Also, in case the parameter information is stored in a barcode, the sensor module 4 comprises a barcode reader for reading this information and providing it to the digital signal processor 41.

The digital signal processor 41 performs a post-processing of the digitized measuring signal 401 taking the temperature information 303 and parameter information 304 provided by the communication unit 44 into account. Therefore, the digital signal processor 41 generates the final measuring result 402. It can be either stored within the sensor module 4 or transmitted to a further measuring device 2 by use of the optional communication unit 40 as measuring result 13.

Separating the sensor module 4 from the combined module 3, and especially from the detector module 3a and the antenna module 3b is especially advantageous, since it allows for providing small and simple components within the detector module 3a and antenna module 3b, allowing for placing these modules extremely close to the device under test, while providing large components within the sensor module 4, which can be placed at a significant distance from the device under test. Especially by performing this separation of components, it is possible to reduce the requirements regarding the transmission of high frequency signals, since the transmission through the cable 5 only has a low sensitivity to interference.

Also, this separation of components is advantageous, since it is possible to provide an optimal temperature control of the sensor module 4, while this is not possible for the detector module 3a and the antenna module 3b. Therefore, the analog-digital-converter which is especially prone to noise can be kept at optimally low temperatures.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate date with the processor through a variety of known means.

The invention is not limited to the examples and especially not to the specific components shown here. The characteristics of the exemplary embodiments can be used in any advantageous combination.

Although the present invention and its advantages have been described in detail, it should be understood, that various changes, substitutions and alterations can be made herein without departing from the spirit and scope of the invention as defined by the appended claims.

What claimed is:

1. A measuring system for measuring a high frequency signal, comprising: an antenna module, adapted for receiving the high frequency signal, a detector module, adapted for deriving a measuring signal from the high frequency signal, and a sensor module, adapted for measuring the measuring signal, wherein the sensor module is arranged in a housing, wherein the detector module is not arranged in the housing, wherein the detector module is connected to the sensor module by a first cable, adapted to transmit the measuring signal from the detector module to the sensor module, wherein the antenna module or the detector module comprises a storage unit, adapted to store parameters of the antenna module or the detector module, wherein the parameters of the antenna module or the detector module are calibration parameters, wherein the storage unit is a flash memory or a magnetic memory; and wherein the antenna module or the detector module comprise a communication unit, adapted to transmit the respective parameters of the antenna module or the detector module stored in the respective storage unit to the sensor module.

2. The measuring system of claim 1, wherein the antenna module and the detector module are integrated into a combined module.

3. The measuring system of claim 1, wherein the antenna module is connected to the detector module by a second cable.

4. The measuring system of claim 1, wherein the detector module comprises a chopper, adapted to modulate a signal derived from the high frequency signal, resulting in a signal the measuring signal is derived from.

5. The measuring system of claim 1,
wherein the detector module comprises a detector, adapted to perform a detection of a signal derived from the high frequency signal, or
wherein the detector is a diode sensor, adapted to perform a rectification of the signal derived from the high frequency signal.

6. The measuring system of claim 5,
wherein the antenna module comprises a slotline antenna,
wherein the antenna module comprises a transformer adapted to transform a slotline antenna signal provided by the slotline antenna into a coplanar antenna signal, and
wherein the detector is adapted to receive the coplanar antenna signal.

7. The measuring system of claim 1, wherein the detector module comprises a first amplifier, adapted to amplify a signal derived from the high frequency signal resulting in the measuring signal.

8. The measuring system of claim 1,
wherein the antenna module or the detector module comprises a temperature sensor adapted to determine a present temperature, and
wherein the antenna module or the detector module comprises a communication unit adapted to transmit the present temperature determined by the temperature sensor to the sensor module.

9. The measuring system of claim 1, wherein the storage unit is an RFID chip, or a barcode, and wherein the sensor module is adapted to read the parameters of the antenna module or the detector module stored in the storage unit.

10. The measuring system of claim 1, wherein the sensor module comprises a second amplifier adapted to amplify the measuring signal received from the detector module.

11. The measuring system of claim 1, wherein the sensor module comprises an analog-digital-converter, adapted to digitize a signal derived from the measuring signal received from the detector module.

12. The measuring system of claim 1, wherein the sensor module comprises a digital signal processor adapted to perform post processing on a signal derived from the measuring signal received from the detector module.

13. The measuring system of claim 12,
wherein the sensor module comprises a first communication unit, adapted to:
receive from the detector module or the antenna module a present temperature of the detector module or the antenna module, or
receive from the detector module or the antenna module parameters of the detector module or the antenna module, and wherein the digital signal processor is adapted to perform the post processing of the signal derived from the measuring signal, received from the detector module, compensating for:
the present temperature of the detector module or the antenna module, or
the parameters of the detector module or the antenna module.

* * * * *